(12) United States Patent
Praino, Jr. et al.

(10) Patent No.: US 11,618,186 B2
(45) Date of Patent: Apr. 4, 2023

(54) METHOD FOR FORMING AN ARTICLE COMPRISING A PATHWAY OF PARTICLES WHEREIN A TERMINATION OF THE PATHWAY OF PARTICLES EXPOSED

(71) Applicant: Condalign AS, Kjeller (NO)

(72) Inventors: Robert F. Praino, Jr., Westwood, MA (US); Denise A. Radkowski, Medfield, MA (US); Henrik Hemmen, Oslo (NO)

(73) Assignee: CONDALIGN AS, Kjeller (NO)

(*) Notice: Subject to any disclaimer, the term of this patent is extended or adjusted under 35 U.S.C. 154(b) by 0 days.

(21) Appl. No.: 17/371,214

(22) Filed: Jul. 9, 2021

(65) Prior Publication Data
US 2022/0134609 A1    May 5, 2022

Related U.S. Application Data

(63) Continuation of application No. 15/312,485, filed as application No. PCT/EP2015/061244 on May 21, 2015, now abandoned.

(30) Foreign Application Priority Data

May 21, 2014    (EP) .................................... 14169206

(51) Int. Cl.
*B29C 41/00*    (2006.01)
*C09J 9/02*    (2006.01)
(Continued)

(52) U.S. Cl.
CPC ............ *B29C 41/003* (2013.01); *B29C 41/02* (2013.01); *B29C 41/50* (2013.01); *C09J 7/245* (2018.01);
(Continued)

(58) Field of Classification Search
CPC ....... B29C 41/003; B29C 41/02; B29C 41/50; C09J 7/245; C09J 9/02; C09J 201/00;
(Continued)

(56) References Cited

U.S. PATENT DOCUMENTS

RE21,762 E    4/1941  Drew
4,820,376 A    4/1989  Lambert et al.
(Continued)

FOREIGN PATENT DOCUMENTS

CN    1712483    12/2005
CN    102483970    5/2012
(Continued)

OTHER PUBLICATIONS

Ball, D.W., "The Chemical Composition of Honey", Journal of Chemical Education; vol. 84, No. 10, Oct. 2007.
(Continued)

*Primary Examiner* — Cynthia L Schaller
(74) *Attorney, Agent, or Firm* — Ballard Spahr LLP

(57) ABSTRACT

The invention relates to a method for forming an article comprising a pathway of particles wherein a termination of the pathway of particles is exposed. The method comprises arranging the particles by applying an electric field and/or a magnetic field at an interface between a water soluble or a non-water soluble matrix and a matrix comprising a viscous material and particles. After fixating the viscous material, the termination is exposed by dissolving the water soluble or non-water soluble matrix. The invention also relates to articles obtainable by said method, and to the use of said method in various applications.

13 Claims, 3 Drawing Sheets

(51) Int. Cl.
*H01B 1/22* (2006.01)
*H01B 1/16* (2006.01)
*H01B 1/24* (2006.01)
*H01B 1/18* (2006.01)
*C09J 7/24* (2018.01)
*B29C 41/02* (2006.01)
*B29C 41/50* (2006.01)
*H01B 13/00* (2006.01)
*H01F 1/28* (2006.01)
*H05K 3/10* (2006.01)
*B29K 29/00* (2006.01)
*B29K 105/16* (2006.01)
*B29K 505/14* (2006.01)
*B29K 507/04* (2006.01)
*B29L 31/34* (2006.01)
*C09J 201/00* (2006.01)

(52) U.S. Cl.
CPC .......... *C09J 9/02* (2013.01); *H01B 1/16* (2013.01); *H01B 1/18* (2013.01); *H01B 1/22* (2013.01); *H01B 1/24* (2013.01); *H01B 13/0036* (2013.01); *B29K 2029/04* (2013.01); *B29K 2105/16* (2013.01); *B29K 2505/14* (2013.01); *B29K 2507/04* (2013.01); *B29K 2995/0005* (2013.01); *B29K 2995/0008* (2013.01); *B29L 2031/3462* (2013.01); *C09J 201/00* (2013.01); *C09J 2301/314* (2020.08); *C09J 2301/40* (2020.08); *C09J 2301/408* (2020.08); *C09J 2429/006* (2013.01); *H01F 1/28* (2013.01); *H05K 3/105* (2013.01)

(58) Field of Classification Search
CPC .............. C09J 2301/314; C09J 2301/40; C09J 2301/408; C09J 2429/006; H01B 1/16; H01B 1/18; H01B 1/22; H01B 1/24; H01B 13/0036; B29K 2029/04; B29K 2105/16; B29K 2505/14; B29K 2507/04; B29K 2995/0005; B29K 2995/0008; B29L 2031/3462; H01F 1/28; H05K 3/105

See application file for complete search history.

(56) References Cited

U.S. PATENT DOCUMENTS

| | | | |
|---|---|---|---|
| 5,045,249 A | 9/1991 | Jin et al. | |
| 5,509,815 A | 4/1996 | Jin et al. | |
| 5,975,922 A | 11/1999 | Jin et al. | |
| 6,322,713 B1 | 11/2001 | Choi et al. | |
| 2011/0155945 A1 | 6/2011 | Soong | |
| 2012/0145315 A1 | 6/2012 | Knaapila et al. | |
| 2012/0209056 A1 | 8/2012 | Kim | |
| 2012/0231178 A1* | 9/2012 | Svasand | H05F 3/025 427/532 |
| 2012/0280138 A1 | 11/2012 | Choi et al. | |
| 2015/0176147 A1* | 6/2015 | Hoyer | H01F 1/375 428/221 |

FOREIGN PATENT DOCUMENTS

| | | |
|---|---|---|
| EP | 0302631 | 2/1989 |
| WO | WO2010151142 | 12/2010 |
| WO | WO2012/076612 A1 * | 6/2012 |
| WO | WO2014001332 | 1/2014 |
| WO | WO2014001334 A1 | 1/2014 |

OTHER PUBLICATIONS

Hardman, K. 15036 in chapter entitled "Polyurethane Adhesives—Data Sheets" located at p. 275 of "Structural Adhesives Directory and Databook"; Chapman & Hall Publishers, 1996.
Knaapila, M., et al. "Aligned Carbon Cones in Free-Standing UV-Curable Polymer Composite", Journal of Polymer Science: Part B: Polymer Physics 2011, 49, 399-403.
Examination Report dated Apr. 9, 2019, for corresponding International Application No. 15724283.5; International Filing Date: Dec. 14, 2016, consisting of 6 pages.
Extended European Search Report dated Nov. 19, 2014, for corresponding International Application No. 14169206.0; International Filing Date: May 21, 2014 consisting of 11 pages.
"Technical Topic: Grease—Its Components and Characteristics"; 2009 Exxon Mobil Coporation (www.mobileindustrial.com).
International Search Report and Written Opinion dated Aug. 5, 2015, for corresponding International Application No. PCT/EP2015/061244; International Filing Date: May 21, 2015, consisting of 10 pages.
The State Intellectual Property Office of China Office Action dated Feb. 1, 2018, for corresponding Chinese Application No. 201580030329.5; Filing date: May 21, 2015 consisting of 2 pages.
The State Intellectual Property Office of China Office Action dated Feb. 11, 2018, for corresponding Chinese Application No. 201580030329; Filing Date: May 21, 2015 consisting of 7 pages.

* cited by examiner

METHOD FOR FORMING AN ARTICLE COMPRISING A PATHWAY OF PARTICLES WHEREIN A TERMINATION OF THE PATHWAY OF PARTICLES EXPOSED

TECHNICAL FIELD

The present invention relates to a method for arranging particles at the interface between a soluble matrix and a matrix comprising a viscous material and particles. The soluble matrix and the matrix comprising a viscous material and particles are essentially immiscible with each other, and also exhibit different solubilities allowing for selective dissolution of the soluble matrix without or essentially without dissolving the matrix comprising a viscous material and particles. The invention also relates to articles obtainable by said method.

BACKGROUND OF THE INVENTION

Anisotropic materials are formed in a wide and increasing range of applications. Typically, such materials include conductive particles fixated in a non-conductive matrix material. The conductive particles are intended to form conductive pathways in the matrix material so as to enable the anisotropic material to be, at least under certain circumstances, electrically conductive.

Depending on the selection of particles and matrix materials, the anisotropic materials may be formed to be suitable for various applications, such as for sensors, such as stress sensors, in solar cell applications, printed electronics, capacitors, batteries, touch screens, displays, smart windows and membranes.

Prior art methods for forming anisotropic materials often involve providing a viscous mixture including the matrix material and conductive particles, applying an electric field over the viscous mixture so as to cause the conductive particles to align to form conductive pathways in the mixture, and thereafter curing the viscous mixture.

Alternatively, it has been proposed to use the magnetic properties of the particles to cause the particles to align and to form conductive pathways. WO 2008/153679 is such an example, where a viscoplastic material including a plurality of magnetic particles is subject to a magnetic field for a time sufficient to at least partly align a portion of the magnetic particles to a predetermined position.

However, the prior art methods generally result in the anisotropic materials containing conductive pathways embedded within the matrix material so that direct contact with the conductive pathways may only take place where the terminal points of the conductive pathways are exposed at the surface or edges of the anisotropic material. This exposure of only a small part the conductive pathways may be a drawback in applications requiring access to a larger part of the conductive pathways, and may decrease the electrical conductivity of the materials, as all electrical current has to pass through a very limited number of exposed contact points.

To further increase the versatility of anisotropic materials it is therefore desired to allow for exposing the conductive pathways entirely or to significantly increase the number of exposed nodes to the conductive network. Depending on the desired use of the anisotropic material at least some of the conductive pathways may be partly or entirely exposed using mild removal means.

To increase the versatility of the anisotropic materials formed, and to enable industrial production thereof, there is a need for methods for forming materials in this field.

It is an object of the invention to provide a method fulfilling said need.

SUMMARY OF THE INVENTION

The above-mentioned object is achieved by a method for arranging particles at an interface between a soluble matrix and a matrix comprising a viscous material and particles.

The method comprises the steps of:
  contacting the soluble matrix and/or the matrix comprising a viscous material and particles with a support comprising at least one side, said at least one side of the support facing the soluble matrix and/or the matrix comprising a viscous material and particles,
  placing the soluble matrix in contact with the matrix comprising a viscous material and particles thereby providing a structure comprising at least one interface between said soluble matrix and said matrix comprising a viscous material and particles,
  subjecting the particles in said structure to an electric field and/or a magnetic field thereby forming the particles into at least one pathway of particles, said at least one pathway of particles comprising a termination at the at least one interface between the soluble matrix and the matrix comprising a viscous material and particles, and
  fixating the viscous material so as to fixate the at least one pathway of particles, characterized in that said termination is exposable upon removal of the soluble matrix.

The soluble matrix may be a water soluble matrix or a non-water soluble matrix. The termination may be exposed upon removal of the soluble matrix. Removal of the soluble matrix may take place by dissolution. Thus, there is provided a method for arranging particles at an interface between a water soluble or non-water soluble matrix and a matrix comprising a viscous material and particles, said method comprising the steps of:
  contacting the water soluble or non-water soluble matrix and/or the matrix comprising a viscous material and particles with a support comprising at least one side, said at least one side of the support facing the water soluble or non-water soluble matrix and/or the matrix comprising a viscous material and particles,
  placing the water soluble or non-water soluble matrix in contact with the matrix comprising a viscous material and particles thereby providing a structure comprising at least one interface between said water soluble or non-water soluble matrix and said matrix comprising a viscous material and particles,
  subjecting the particles in said structure to an electric field and/or a magnetic field thereby forming the particles into at least one pathway of particles, said at least one pathway of particles comprising a termination at the at least one interface between the water soluble or non-water soluble matrix and the matrix comprising a viscous material and particles, and
  fixating the viscous material so as to fixate the at least one pathway of particles, characterized in that said termination is exposed upon removal by dissolution of the water soluble or non-water soluble matrix.

The soluble matrix may further comprise particles. The particles may be the same or different from those contained in the matrix comprising a viscous material and particles. Addition of particles to the soluble matrix allows for increasing the concentration of particles at the interface between the soluble matrix and the matrix comprising viscous material and/or to ensure that particles may protrude from the matrix comprising a viscous material into the soluble matrix. Upon application of the electric field and/or the magnetic field the particles will form at least one pathway of particles comprising a termination arranged at the interface between the soluble matrix and the matrix comprising viscous material. As long as the smallest linear dimension of said particles is larger than the thickness of the soluble matrix, at least some part of said particles will be included within the matrix comprising viscous material. After fixating the matrix comprising a viscous material, said particles will be included and fixated in the matrix comprising viscous material even when the soluble matrix is subsequently removed. Upon removal of the soluble matrix the particles contained solely therein will also be removed.

The soluble matrix and/or the matrix comprising a viscous material and particles may be contacted with a support. As described above, the soluble matrix may comprise particles. The use of a support facilitates handling. For instance, the soluble matrix may be contacted with a support after which the matrix comprising a viscous material and particles is applied to the soluble matrix. The viscous material may be contacted with a support prior to or after application onto the soluble matrix. The support used for the soluble matrix and the matrix comprising a viscous material and particles may be the same or different, and may be provided with at least one side facing the soluble matrix and/or the viscous matrix.

The at least one side of the solid support may be subjected to a surface modification technique in order to modify its properties with respect to, for instance, adhesive or coating layer application. As an example, the surface modification technique may be corona, plasma or flame treatment which is known in the art. By selecting the appropriate surface modification technique, the desired surface properties for depositing and/or removing the support may be achieved.

The support may be made of a solid material comprising one or more polymers. For instance, the support may include, but is not limited to, a polyester such as polyethylene terephthalate (PET) or polyethylene naphthalate (PEN), polypropylene, polycarbonate, or polyimide as known to those skilled in the art. The support may also be a rigid material such as glass or metal.

The soluble matrix applied to the support may partially or entirely cover the support. The soluble matrix may be applied onto the support as a coating, layer or film. The thickness of the coating, layer or film may vary depending on the application. For instance, the thickness of the coating, layer or film may range from 0.05 micrometers to 200 micrometers, or from 0.15 micrometers to 20 micrometers.

The expression "interface between the soluble matrix and the matrix comprising a viscous material and particles" is understood to be the boundary region between the soluble matrix and the matrix comprising a viscous material and particles.

It will be appreciated that the soluble matrix and the matrix comprising a viscous material and particles are not miscible with each other, or are miscible to a very limited extent with each other. Thus, the soluble matrix and the matrix comprising a viscous material and particles may be immiscible. Alternatively, the soluble matrix and the matrix comprising a viscous material may be miscible to a limited extent such as from 1 to 5 weight %. Therefore, placing the soluble matrix in contact with the matrix comprising viscous material and particles results in the formation of at least one interface between the soluble matrix and the matrix comprising viscous material. No or limited disruption or diffusion of the soluble matrix takes place when it is contacted with a matrix comprising a viscous material, and vice versa. The soluble matrix may be contacted with the matrix comprising viscous material by depositing the matrix comprising viscous material onto the soluble matrix.

It will be appreciated that the termination or a node of the at least one pathway of particles being arranged at an interface between the soluble matrix and the matrix comprising viscous material may be located at and/or adjacent to and/or in the vicinity of the boundary region between the soluble matrix and the matrix comprising viscous material. The particles that are located at the interface may protrude from the matrix comprising a viscous material into the soluble matrix through the interface formed between the soluble matrix and the matrix comprising viscous material. Further, the termination of the at least one pathway of particles may be at the interface in the plane with the matrix comprising a viscous material but without extending into the soluble matrix. Additionally or alternatively, if the particles are freely able to move from the matrix comprising viscous material to the soluble matrix, the individual particle size may be larger than the thickness of the soluble matrix so that at least a part of the particles remain in the matrix comprising a viscous material.

As described herein, fixating the viscous material of the matrix comprising a viscous material leads to fixating the at least one pathway of particles. The overall result is a structure in which at least a part of the particles form at least one pathway of particles comprising a termination, said termination being arranged at the interface between the soluble matrix and the matrix comprising a viscous material and particles. The at least one pathway of particles may be connected to further pathway of particles and/or to further particles thereby forming part of a network of particles in the matrix comprising a viscous material and/or the soluble matrix. Thus, the at least one pathway of particles may form part of a network of particles. Upon removal of the soluble matrix, the termination of the at least one pathway of particles may act as node(s) to connect with a continuous network of particles located within the matrix comprising a viscous material. Alternatively, the at least one pathway of particles may be a single particle, where removal of the soluble matrix exposes part of said single particle at the surface(s) of the matrix comprising a viscous material.

In case the soluble matrix comprises particles that do not protrude into the matrix comprising a viscous material, these will be removed together with the soluble matrix.

Fixation of the viscous material may be achieved by any suitable method, such as, for example, curing, ceramisation, cross-linking, gelling, irradiating, drying, heating, sintering or firing.

Curing may take place by actinic radiation such as ultraviolet radiation (UV), heat and/or addition of chemical additives.

The at least one pathway of particles in the method described herein may be an electrically conducting pathway of particles.

The method described herein may further comprise the step of:
  removing the support. The support may be removed from the soluble matrix and/or the matrix comprising a viscous material and particles.

Removal of the support may take place using mechanical means such as peeling or pulling apart. Surface treatment of the at least one side of the support as described herein may facilitate removal of the support. In case there is more than one support, removal may take place in such a way that one or more support(s) is/are removed. For instance, one, two or all supports may be removed. After removal of the support, the resulting structure may comprise or consist of a soluble matrix, a matrix comprising fixated viscous material, and at least one interface between said soluble matrix and said matrix comprising a viscous material. The matrix comprising a fixated viscous material comprises said at least one pathway of particles. Further, the soluble matrix may also comprise particles and/or at least one pathway of particles. As described herein, the at least one pathway of particles may form a network and/or part of a network of connected particles, or be a single particle. The at least one pathway of particles comprises a termination or node at said interface between the soluble matrix and the matrix comprising fixated viscous material, said termination being exposable upon removal of the soluble matrix.

After removal of the support, there is provided an article comprising:
  a soluble matrix,
  a matrix comprising a fixated viscous material,
  at least one interface between said soluble matrix and said matrix comprising a viscous material, and
  at least one pathway of particles comprising a termination at said interface.

The article is characterized in that said termination is exposable upon removal of said soluble matrix. The soluble matrix and/or the matrix comprising fixated viscous material may comprise the at least one pathway of particles comprising a termination. The article may be obtainable by the method described herein.

The soluble matrix may serve as a protective body for the termination of the at least one pathway of particles thereby facilitating handling and transportation. The soluble matrix being a protective body may have the shape of a coating, layer or film. The protective body may be kept as long as the structure needs to be handled, and is then easily removed prior to use.

Accordingly, the method described herein may further comprise the step of:
  removing the soluble matrix by chemical means.

It will be appreciated that the solubility of the soluble matrix and the matrix comprising fixated viscous material differ, such that the soluble matrix can be dissolved without dissolving or damaging the matrix comprising fixated viscous material. Advantageously, the soluble matrix may be a water soluble matrix. Examples of chemical means suitable for removal of a water soluble matrix include rinsing with water and/or with an aqueous solution. Examples of chemical means suitable for removal of a non-water soluble matrix includes rinsing with acids, bases, or organic solvents such as alcohols, esters, ketones, aldehydes, ethers, or hydrocarbons. Upon removal of the soluble matrix the termination of said at least one pathway of particles is exposed. As a result, the exposed termination of said at least one pathway of particles may conveniently be connected to external electrical means. This is a significant benefit, since it allows for connecting the at least one pathway of particles embedded within the matrix comprising viscous material to external electrical means via said termination. Further, removal of the soluble matrix by chemical means is a mild way of removal, thereby, avoiding or minimizing mechanical damage of the fixated viscous material and/or the exposed termination of the at least one pathway of particles. Thus, there is no need for etching or abrasive procedures that may damage the particles and/or disrupt and break the network of particles.

In contrast, if no soluble matrix is present and an electric field is applied to particles in a matrix comprising a viscous material such as an adhesive or elastomeric matrix, the particles will move and arrange within the matrix comprising a viscous material. Depending on the nature of the matrix comprising a viscous material and its interface with a support or the properties of its free surface, the particles may be completely embedded within the viscous material such as an adhesive or an elastomeric matrix and are rendered inaccessible, i.e. the particles are embedded within and/or covered by viscous material and therefore not exposed. As a consequence, external electrical means cannot be directly connected to the particles arranged within the matrix.

After removal of the soluble matrix the resulting structure comprises or consists of a matrix comprising fixated viscous material and at least one pathway of particles. The at least one pathway of particles comprises a termination which is exposed at a surface of the fixated viscous material. The structure may further comprise one or more supports. Thus, there is provided an article consisting or comprising of a matrix comprising fixated viscous material and at least one pathway of particles, said at least one pathway of particles having a termination at a surface of said matrix, characterized in that said termination at said surface is exposed. The at least one pathway of particles may form part of a network of particles such as a continuous network of particles. The article may be obtainable by the method described herein.

There is also provided an article obtainable by the method described herein.

The water soluble matrix comprises or consists of a water soluble material. For instance, the soluble matrix may consist of or comprise at least one water soluble polymer. Examples of water soluble polymers include of polyvinyl alcohol, cellulose ethers, polyethylene oxide, starch, polyvinylpyrrolidone, polyacrylamide, polyvinyl methylether-maleic anhydride, polymaleic anhydride, styrene maleic anhydride, hydroxyethyl cellulose, methylcellulose, polyethylene glycols, carboxymethylcellulose, polyacrylicacid salts, alginates, acrylamide copolymers, guar gum, casein, ethylene-maleic anhydride resin, polyethyleneimine, ethyl hydroxyethylcellulose, ethyl methylcellulose, and hydroxyetyl methylcellulose. It will be appreciated that the soluble matrix may include mixtures of different water soluble polymers. Further, the at least one polymer may be polyvinyl alcohol. They soluble matrix may include one or more cross-linking agent(s) to improve and/or facilitate handling during processing. The soluble matrix may also include one or more additives to improve layer coating quality such as those materials identified in the industry as thickeners or levelling agents, for instance polyethylene glycol p-(1,1,3,3-tetramethylbutyl)-phenyl ether (TX-100), to improve layer application or levelling. The layer may also include colorants or pigments.

The viscous material of the matrix comprising a viscous material and particles may comprise one or more polymers, monomers or oligomers. For instance, the viscous material may be an adhesive and/or an elastomeric material. The polymers may be thermoset or thermoplastic polymers such as polyacrylates, polyepoxides, polyurethanes and/or polysilicones. As used herein, a viscous matrix will to some extent resist movement of an object such as a particle through the matrix material, so that the particles will not sediment immediately. For instance, the viscous material may have a viscosity of about 300 cP or more, such as about 1000 cP, 35000 cP or about 40000 cP. As an example, the viscous matrix may have a viscosity within the range of about from 300 cP to about 40000 cP. In this document, cP stands for centipoise. As an example, the viscous material may comprise or consist of Dymax 3094, which may have a viscosity of about 1000 cP. In a further example, the viscous material may comprise or consist of Norland NOA81, which may have a viscosity of about 300 cP.

To be displaceable by use of a magnetic field, the particles may advantageously be paramagnetic or ferromagnetic, preferably ferromagnetic.

Further, to be displaceable by use of an electric field, the particles may advantageously be electrically conductive and/or be made of one or more materials having a relative permittivity that is much smaller or much larger than that of the matrix.

The particles may be homogenous particles, i.e. a particle consists of a single material or material mixture throughout the particle ranging in size, shape and/or material composition. However, the particles may also be heterogenous particles, i.e. a particle consisting of several materials. For example, the particles may have a core of one material, and a sheath of another material. The particles may also contain contaminants that enhance performance, such as electrical conductivity or magnetism.

The particles described herein may comprise only one type of particles, but may also be a mixture of different types of particles. The particles may be paramagnetic and/or ferromagnetic. The particles may also be electrically conductive.

The particles may be flat and/or have a spherical, elongated, tubular, discotic, wirey or irregular shape or a combination of shapes.

The particles may include carbon, metal and/or metal alloys. For instance, the particles may consist of or comprise silver, iron, graphite, nickel, copper, gold, sink, titanium, or aluminum.

Advantageously, at least some particles may be both para- or ferro magnetic, and electrically conductive. Alternatively, there may be a mixture of paramagnetic or ferromagnetic particles. Such particles will be displaceable by both magnetic and electric fields.

Advantageously, the amount of particles includes particles of metal and/or metal alloys such as nickel or iron oxide. The particles may also include carbon allotropes, such as for example graphite, graphene, carbon nanotubes, buckminsterfullerenes, amorphous carbon, or carbon black. Further, the particles may be selected from the group consisting of silver-iron particles, silver-nickel particles, graphite-nickel particles, nickel particles, carbon-nano particles and mixtures thereof. Advantageously, the particles may also include core-shell particles with a ceramic, glass or polymeric core, and a shell of conductive metal.

The particle size, i.e. the largest linear dimension of the particles, may range from 0.3 to 500 micrometers, or from 0.5 to 200 micrometers or from 1 to 100 micrometers, or from 3 to 50 micrometers.

The concentration of the particles in the matrix comprising a viscous material and/or in the water soluble matrix may be less than the percolation threshold. For instance, the concentration of the particles may range from 0.001 to 10 vol %, or 0.01 to 2 vol %, or 0.01 to 1.5 vol %, or 0.1 to 1.5 vol %.

For conductive mixtures a "percolation threshold" is defined as the lowest concentration of conductive particles necessary to achieve long-range conductivity in a random system. Such a random system is nearly isotropic. In a system formed by a method according to the invention the concentration of conductive particles necessary for achieving conductivity in a predefined direction is not determined by the percolation threshold and the concentration can be lower. For practical reasons the concentration of particles is determined by the requirements on the conductive paths, there usually being no reason to have excess amounts of conductive particles not arranged into conductive paths.

The method described herein may also comprise the step of:
    drying the soluble matrix after application onto the support. Drying methods include, but are not limited to, convective heating, infrared heating with or without convection, RF drying, freeze drying, etc.

The field applied to the particles in the structure comprising at least one interface between the water soluble matrix and the matrix comprising a viscous material and particles as described herein may be an electric field, a magnetic field or a combination thereof. The electric field may be a direct electric field (DC) or an alternating electric field (AC). The RMS electric field strength may range from 1 to 100 kV/cm such as 1 to 50 kV/cm, or 5 to 25 kV/cm. The electric field may have a frequency from 10 Hz to 10 MHz, such as from 0.1 kHz to 200 kHz, or from 0.1 kHz to 25 kHz.

The field may be applied in a direction that is perpendicular or essentially perpendicular to the extension of the interface(s) between the soluble matrix and the matrix comprising a viscous material and particles. When the field is applied in a direction that is perpendicular to the extension of the interface(s), the field line is perpendicular to the extension of the interface(s). When the field is applied in a direction that is essentially perpendicular to the interface(s), the field line forms an angle of 45° or less with a line being perpendicular to the extension of the interface(s).

The field may also be applied in a direction that is parallel or essentially parallel with the extension of the interface(s). When the field is applied in a direction that is parallel to the extension of the interface(s), the field line is parallel to the extension of the interface(s). When the field is applied in a direction that is essentially parallel to the extension of the interface(s), the field line forms an angle that is 45° or less with the extension of the interface(s).

If more than one field is applied the first field may be applied in a direction that is perpendicular or essentially perpendicular to the extension of the interface(s) between the soluble matrix and the matrix comprising a viscous material and particles. Alternatively, the first field may be applied in a direction that is parallel or essentially parallel with the extension of the interface(s). The second and/or further field may be applied in a direction that is perpendicular or essentially perpendicular to the extension of the interface(s). Alternatively, the second and/or further field being applied may have a flux line that is parallel or essentially parallel with the extension of the interface(s). It will be appreciated that a flux line being essentially parallel with the extension of the interface(s) may form an angle of 45° or less with the extension of the interface.

The first field may be an electric field or a magnetic field. The second or further field may be an electric field or a magnetic field. When more than one field is applied the first field may be an electric field and the second or further field may be a magnetic field or vice versa. When more than one field is applied, the fields may be applied sequentially, or at the same time.

The field applied to the particles may be an electric field that is applied in a direction that is perpendicular or essentially perpendicular to the extension of the interface(s) between the soluble matrix and the matrix comprising a viscous material and particles.

Upon application of the electric field and/or magnetic field at least one pathway of particles will form in the matrix comprising a viscous material and particles. In case the soluble matrix comprises particles at least one pathway of particles may also be formed in said soluble matrix. The at least one pathway of particles comprises a termination at the interface between the soluble matrix and the matrix comprising a viscous material and particles. The movement of the particles may be due to electrophoresis, dielectrophoresis, magnetophoresis, or a combination of the above, depending on the type(s) of fields used. While most of the particles in the matrix comprising a viscous material move so that they are arranged within the viscous material and/or at or in the vicinity of the interface between the soluble matrix and the matrix comprising a viscous material, some particles may also diffuse from the matrix comprising a viscous material into the soluble matrix. As described herein, the at least one pathway of particles may form a continuous connected network of particles in the matrix comprising a viscous material and particles. Due to the presence of the soluble matrix at least a portion of the particles may protrude out from the matrix comprising a viscous material and particles and into the soluble matrix and/or arrange at the interface between the soluble matrix and the matrix comprising a viscous material.

The at least one pathway of particles described herein may form connected, conductive pathways or networks which are continuous or partially continuous. The pathway of particles being part of a network may be comprised in the matrix comprising a viscous material and, optionally, also in the soluble matrix. However, as described herein removal of the soluble matrix leads to concomitant removal of particles therein.

The application of the field may be interrupted when the particles stop or essentially stop moving as seen by the naked eye or with the aid of an instrument. Typically the process is complete within seconds to a few minutes, making it possible to use the method described herein in an industrial process.

The method described herein may comprise the steps of:
providing a support comprising at least one side,
depositing a soluble matrix onto said at least one side of said support,
depositing a matrix comprising a viscous material and particles onto said soluble matrix thereby providing a structure comprising an interface between the soluble matrix and the matrix comprising a viscous material and particles,
subjecting the particles in said structure to an electric field and/or a magnetic field thereby forming the particles into at least one pathway of particles comprising a termination at said interface, and
fixating said viscous material so as to fixate the at least one pathway of particles, characterized in that said termination is exposable upon removal of said soluble matrix.

Further, the method described herein may comprise the steps of:
providing a support comprising at least one side,
depositing a soluble matrix onto said at least one side of the support,
depositing a matrix comprising viscous material and particles onto said soluble matrix thereby providing a structure comprising an interface between said soluble matrix and said matrix comprising a viscous material and particles,
contacting a further soluble matrix with a further support,
depositing said further soluble matrix being contacted with said further support onto said matrix comprising a viscous material and particles, thereby forming a second interface between said matrix comprising viscous material and said further soluble matrix,
subjecting the particles in said structure to an electric field and/or a magnetic field thereby forming the particles into at least one pathway of particles comprising a termination at said interface and/or at said second interface or at both said interfaces, and
fixating said viscous material so as to fixate the at least one pathway of particles, characterized in that said termination is exposable upon removal of said water soluble matrix.

The articles described herein may be used in various applications such as printed electronics, RF shielding, transistors, strain sensors, membrane switches, capacitors, batteries, displays, touch screens, lightning strike protection, anisotropic conductive films, smart windows, and active displays There is also provided the use of a method as described herein for creating printed electronics.

There is also provided the use of a method as described herein for creating RF shielding, i.e. radio frequency shielding.

There is also provided the use of a method as described herein for creating transistors.

There is also provided the use of a method as described herein for creating strain sensors.

There is also provided the use of a method as described herein for creating medical sensing devices or medical stimulation devices.

There is also provided the use of a method as described herein for creating three dimensional geometries of conductive pathways.

BRIEF DESCRIPTION OF THE DRAWINGS

The invention will now be further described with reference to exemplary embodiments, with reference to the enclosed drawings, wherein.

The termination of said at least one pathway of particles is arranged at the interface 5 between the soluble matrix 2 and the matrix 3.

Figure 7:
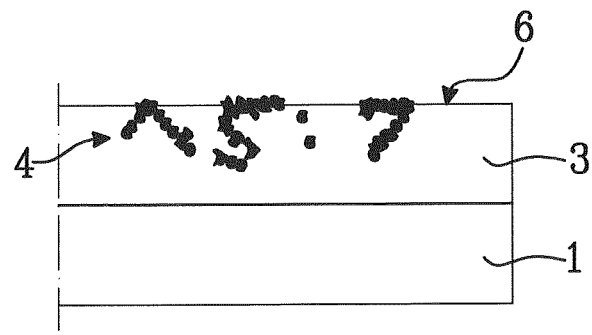

FIG. 7 shows a structure comprising a support 1, a matrix 3 comprising a fixated viscous material and particles 4 at least some of which are in the form of at least one pathway of particles comprising a termination arranged at a surface 6.

Figure 8:
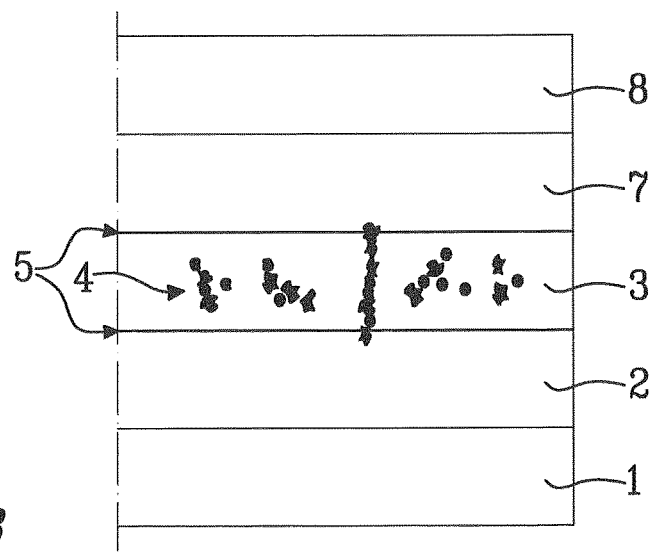

FIG. 8 shows a structure comprising a support 1, a soluble matrix 2, a matrix 3 comprising a viscous material, particles 4, at least some of which as in the form of at least one pathway of particles comprising a termination at interfaces 5 and 6, respectively, a further soluble matrix 7, and a further support 8.

Figure 9:
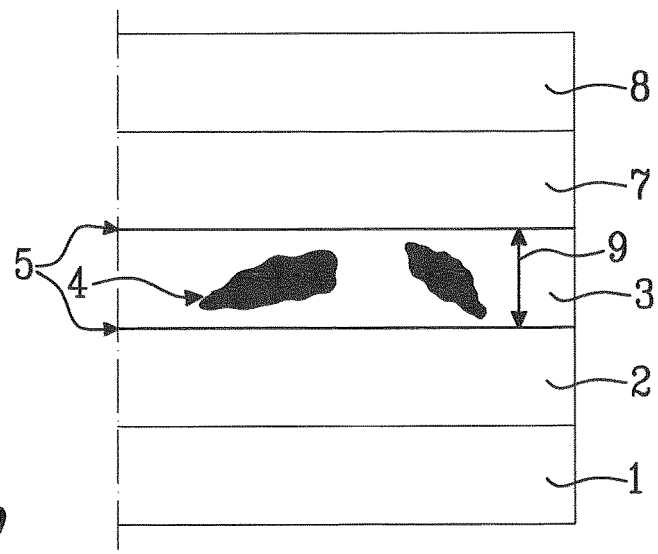

FIG. 9 shows a structure comprising a support 1, a soluble matrix 2, a matrix 3 comprising a viscous material, particles 4, a further soluble matrix 7, and a further support 8. At least some of the particles 4 that are contained within the matrix 3 have a linear dimension that is larger than the thickness 9 of the matrix 3.

Figure 10:
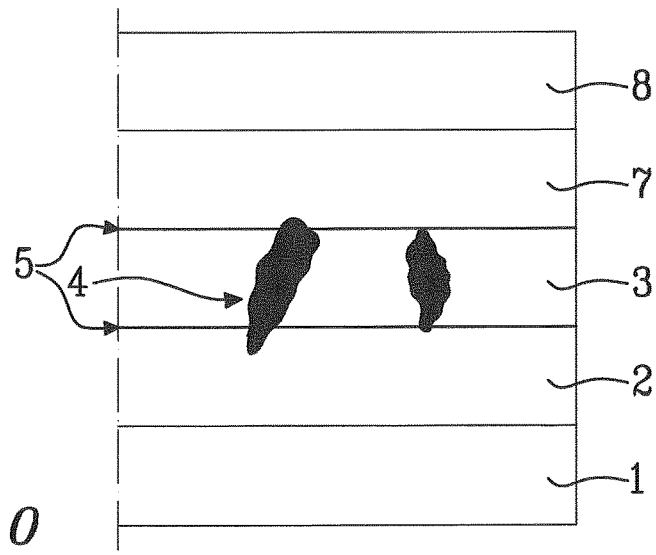

FIG. 10 shows a structure comprising a support 1, a soluble matrix 2, a matrix 3 comprising a viscous material, particles 4, at least some of which as in the form of at least one pathway of particles comprising a termination at both interfaces 5 and 6, wherein said at least one pathway of particles is a single particle that has been arranged by the electric field, a further soluble matrix 7, and a further support 8.

It should be noted that the drawings have not been drawn to scale and that the dimensions of certain features have been exaggerated for the sake of clarity.

DETAILED DESCRIPTION OF PREFERRED EMBODIMENTS

Figure 1:
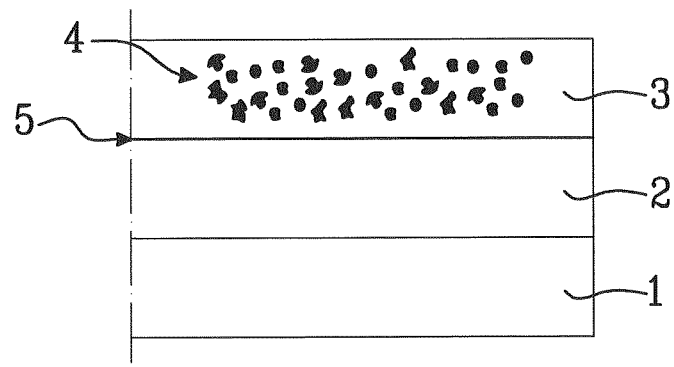
FIG. 1 shows a structure comprising a support 1, a soluble matrix 2 and a matrix 3 comprising a viscous material, particles 4, and an interface 5 between the matrix 2 and the matrix 3.

FIG. 1 shows a structure comprising a support 1, a soluble matrix 2, a matrix 3 comprising a viscous material and particles 4. The soluble matrix 2, the matrix 3 comprising a viscous material and the particles 4 may be as described herein. The particles 4 are contained within the matrix 3. Due to immiscibility or very limited miscibility of the soluble matrix 2 and the matrix 3 an interface 5 is formed between the soluble matrix 2 and the matrix 3. The structure may be formed by coating the support 1 with the soluble matrix 2, optionally followed by drying. Thereafter the matrix 3 containing the particles 4 and a viscous material is deposited onto the soluble matrix 2.

Figure 2:
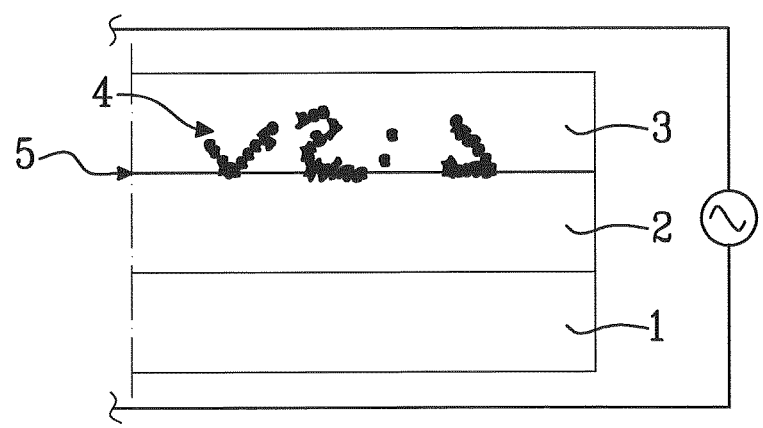
FIG. 2 shows a structure comprising a support 1, a soluble matrix 2, a matrix 3 comprising a viscous material, particles 4 being subjected to an electric field, and an interface 5 between the matrix 2 and the matrix 3.

FIG. 2 shows the application of an electric field to the structure illustrated in FIG. 1. Upon application of the electric field the particles 4 will form at least one pathway of particles comprising a termination, wherein the termination is arranged at the interface 5 between the soluble matrix 2 and the matrix 3. At least part of the pathway of particles may form a network of particles. The termination of the at least one pathway of particles may be arranged in the plane of the interface and/or may protrude from the matrix 3 into the soluble matrix 2 through the interface 5. Advantageously, the electric field is applied until no visible movement of the particles is observed. In cases where the alignment is either too fast or too slow to be easily observed, or where the nature of the particles makes in situ observation of alignment difficult, response of the particles to the electric field can be verified by other means, or verified by observation after the electric field is removed.

Figure 3:
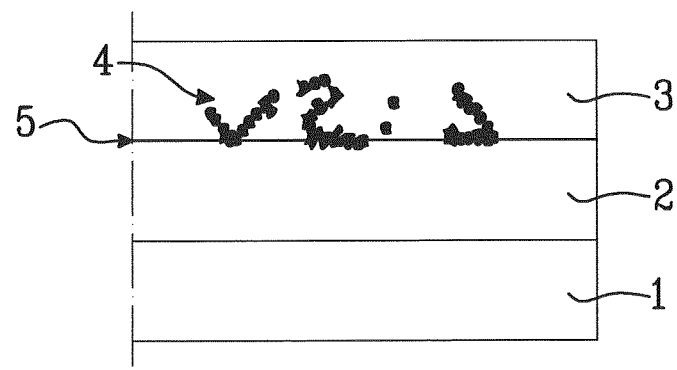
FIG. 3 shows a structure comprising a support 1, a soluble matrix 2 and a matrix 3 comprising a fixated viscous material, and particles 4 at least some of which are in the form of at least one pathway of particles comprising a termination at an interface 5 between the soluble matrix 2 and the matrix 3.

Subsequent to application of an electric field the viscous material of the matrix 3 is fixated so as to fixate said at least one pathway of particles comprising a termination at the interface 5. FIG. 3 shows the resulting structure comprising a support 1, a soluble matrix 2, a matrix 3 comprising a fixated viscous material, the particles 4 at least some of which are in the form of at least one pathway of particles comprising a termination, and the interface 5. At least part of the particles and/or the at least one pathway of particles may form a network of particles. The termination of said at least one pathway of particles is located in the plane of the interface 5 between the matrix 3 without being embedded within or covered by the viscous material of the matrix 3 thereby allowing them to be exposed upon subsequent removal of the soluble matrix 2. Moreover, some of the particles and/or the termination of said at least one pathway of particles and/or network of particles may protrude from the matrix 3 into the soluble matrix 2.

Figure 4:
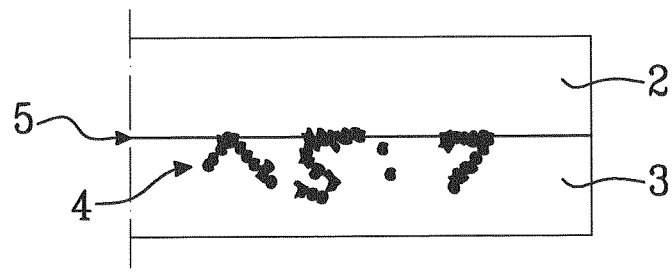
FIG. 4 shows a structure comprising a soluble matrix 2 and a matrix 3 comprising a fixated viscous material, and particles 4 at least some of which are in the form of at least one pathway of particles comprising a termination at an interface 5 between the soluble matrix 2 and the matrix 3.

FIG. 4 shows a structure resulting from removal of the support 1 from the structure shown in FIG. 3. The resulting structure comprises the soluble matrix 2, the matrix 3, the particles 4 at least some of which are in the form of at least one pathway of particles comprising a termination, and the interface 5. The termination of said at least one pathway of particles is arranged at the interface 5. The termination may be located in the plane of the interface 5 and/or protrude from the matrix 3 into the soluble matrix 3.

Figure 5:
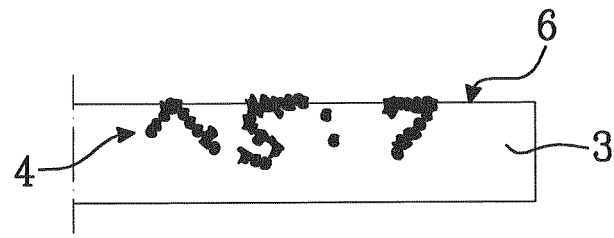
FIG. 5 shows a structure comprising a matrix 3 comprising a viscous material and particles 4 at least some of which are in the form of at least one pathway of particles comprising a termination at a surface 6.

Exposure of the soluble matrix 2 to appropriate chemical means, such as rinsing or washing with a solvent, makes it dissolve thereby exposing the termination of said at least one pathway of particles at a surface 6. The termination may be in the plane of the surface 6 and/or protrude from the surface 6. The resulting structure is shown in FIG. 5. External electrical means may be connected to the network of particles within the matrix 3 via connection with the exposed termination of said at least one pathway of particles.

A support 1 may be deposited on the matrix 3 of the structure illustrated in FIG. 4. The support 1 may be deposited on the side of the matrix 3 opposite to the side facing the soluble matrix 2. The resulting structure is shown in FIG. 6.

Figure 6:
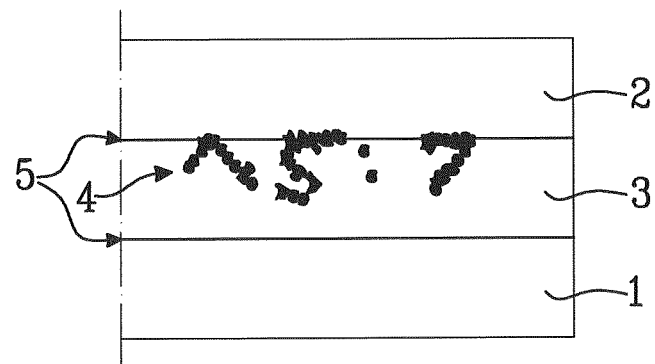
FIG. 6 shows a structure comprising a support 1, a matrix 3 comprising a fixated viscous material, particles 4 at least some of which are in the form of at least one pathway of particles comprising a termination and a soluble matrix 2.

The soluble matrix 2 may then be removed from the structure illustrated in FIG. 6. The removal may take place by chemical means such as rinsing or washing with a solvent thereby exposing the termination of the at least one pathway of particles at the surface 6 and/or protruding from the matrix 3. The resulting structure is shown in FIG. 7.

FIG. 8 shows a structure comprising a support 1, a soluble matrix 2, a matrix 3 comprising a viscous material, particles 4, at least some of which are in the form of at least one pathway of particles comprising a termination at interfaces 5 and 6, respectively, a further soluble matrix 7, and a further support 8. The particles 4 have been exposed to an electric field, causing them to arrange into at least one pathway of particles extending from interface 5 to interface 6. The terminations of the at least one pathway of particles may be arranged in the plane of said interfaces and/or may protrude from the matrix 3 into the soluble matrices 2 and 7 through the interfaces 5 and 6. This structure allows for removal of the soluble matrices 2 and 7 and external electrical means may be connected to said terminations allowing electrical current to be passed through said at least one pathway of particles.

FIG. 9 shows a structure comprising a support 1, a soluble matrix 2, a matrix 3 comprising a viscous material, particles 4, a further soluble matrix 7, and a further support 8. At least some of the particles 4 that are contained within the matrix 3 have a linear dimension that is larger than the thickness 9 of the matrix 3.

FIG. 10 shows the application of an electric field to the structure illustrated in FIG. 9. Upon application of the electric field the particles 4 will be arranged and/or rotated by the electric field and form at least one pathway of particles comprising terminations at interfaces 5 and 6, respectively. It will be appreciated that in this embodiment, said at least one pathway of particles comprises a single particle. The terminations of the at least one pathway of particles protrude from the matrix 3 into the soluble matrices 2 and 7 through the interfaces 5 and 6. Alternatively, the at least one pathway of particles may be arranged in the planes of said interfaces. This structure allows for removal of the soluble matrices 2 and 7 and external electrical means may be connected to said terminations allowing electrical current to be passed through said at least one pathway of particles.

The invention is further illustrated by the following non-limitative examples.

EXAMPLES

Example 1

A polyethylene terephthalate (PET) substrate purchased from Dupont Teijin Melinex 453 was subjected to corona treatment on one of its sides. Then, polyvinylalcohol (PVA) in the form of a 1% by weight aqueous solution of 50/40 Elvanol, PVA, with 0.2% (by weight) polyethylene glycol p-(1,1,3,3-tetramethylbutyl)-phenyl ether, (Triton X100) purchased from Du Pont was applied as a thin film onto the side of the PET substrate having been subjected to corona treatment using a metered coating rod applicator. The coated film was dried in a convection oven in order to remove the water and harden the film resulting in a PVA coating thickness from 0.15 micrometers to 0.60 micrometers on the PET substrate.

Silver particles having a size from 2 to 3.5 micrometers and at a concentration of 0.5% by volume purchased from Sigma-Aldrich were mixed with the UV curable adhesive Dymax 3094 purchased from Dymax Corporation. The resulting adhesive mixture was coated as a film onto the PVA coating using a rod applicator. Due to the incompatibility of the matrix polymers and their relative viscosities the materials did not intermix. The layers were discrete with a defined interface between the layers. The particle-rich adhesive layer had a thickness of about 80 micrometers.

The PET substrate with the PVA coating and the particle-adhesive coating was placed over an electrode with the PVA and adhesive facing away from the electrode. An electric field was created using an interdigitated electrode design with a voltage of 350 volts and a frequency of 10 kHz. The electric field induces electrical dipoles in the silver particles causing them to move towards the regions with highest electrical field gradient, i.e. 5 through the adhesive layer toward the PVA-adhesive interface. Furthermore the silver particles interact with each other through dipole-dipole interactions, thus forming a connective, continuous network with the highest network density being near the adhesive-PVA interface. Some of the connected particles remained at the surface of the adhesive and some connected particles penetrated the interface. For both circumstances, the adhesive polymer does not cover or shield the silver particles. When the particles did not appear to move under magnification and appeared to be connected the network of particles were fixed to prevent further movement which ensures the continuity of the particle connected network. Particle immobilization for network connectivity was accomplished by exposing (crosslinking) the adhesive to a UV light source which cures the adhesive and increases the viscosity of the matrix, thereby rendering the particles immobile, inhibiting particle movement or drift which could otherwise break the particle network. The adhesive matrix with the assembled conductive particles was UV cured using an Omnicure S2000 with a 200-watt mercury short arc lamp delivering an UV spectral output of 350-600 nm.

The film was separated by manually peeling the PET from the PVA and aligned particle-rich adhesive structure. Thereby, providing a two layer structure comprising of a PVA layer, and an adhesive layer with a continuous, connected network of silver particles in which the highest organized network density occurred at the interface.

A second PET support film was attached to the exposed adhesive layer of the two layer structure (opposite to the side facing the PVA coating). Thereafter, the PVA coating was rinsed with water to expose a portion of the network of particles and network nodes at the interfacial surface of the adhesive coating. Once the PVA was completely removed, the film was dried using a forced hot air hand-held heater.

After washing and drying as described above, the resulting structure was subjected to analysis using a Scanning Electron Microscope (SEM) and X-ray elemental analysis. SEM analysis was completed at a magnification of 1500× using a field voltage of 20 kV and the X-ray elemental analysis used an electron beam volume which created a penetrating surface of approximately 0.5-1.0 µm. The results confirmed the formation of a network of silver particles and its exposure at the polymer surface.

Example 2

PVA in the form of a 2% by weight aqueous solution of 50/40 Elvanol PVA purchased from Du Pont was applied using a metered coating rod applicator as a 50 µm thick film onto a PET substrate purchased from Goodfellow. The coated film was dried in a convection oven in order to remove the water and harden the film resulting in a PVA coating thickness of about 1 micrometer on the PET substrate. The PET substrate with the PVA coating was then cut into smaller pieces and two pieces of the substrate was placed on two separate flat transparent electrodes with the PVA facing away from the electrode.

Nickel Graphite particles having a size from 25 to 90 micrometers and at a concentration of 0.5% by volume purchased from Sultzer Metco were mixed with the UV curable adhesive Norland NOA81 purchased from Edmund Optics. The resulting adhesive mixture was deposited with a wooden applicator stick as a drop onto the PVA coated substrate on top of one of the electrodes. Spacers with a defined thickness of 150 µm were placed on top of said electrode, separated from the adhesive mixture. The other electrode was then pressed on top of the mixture, with the PVA coating facing the adhesive, compressing the mixture drop into a circular film with a controlled thickness equal to the thickness of the spacers.

Due to the incompatibility of the PVA and the adhesive and their relative viscosities the materials did not intermix. The resulting sandwich consisted of a series of layers, comprising from one end to another: electrode, substrate, PVA, particle rich adhesive mixture, PVA, substrate, electrode. All layers were discrete with a defined interface between the layers.

An electric field was set up between the electrodes by applying a voltage of 350 volts and a frequency of 10 kHz. The electric field induces electrical dipoles in the silver particles causing them to align into assembled and connected chains. The particle chains extend perpendicular to the plane of the adhesive mixture, creating stacked particle columns which span the gap between the PVA-adhesive interfaces on either side of the mixture. Because of the finite size of the electrodes the electric field is somewhat stronger closer to the electrode than in the center of the gap between them. This causes a dielectrophoretic force on the nickel graphite particles that attracts the ends of the particle chains to the adhesive-PVA interfaces. Some of the connected particles remained at the surface of the adhesive and some connected particles penetrated the interface. For both circumstances, the adhesive polymer does not cover or shield the nickel graphite particles at the PVA-adhesive interface.

After 1 minute, when the particles showed no further movement, as viewed under magnification, the network of particles were fixed to prevent further movement and to ensure the continuity of the particle connected network by curing (crosslinking) the adhesive using a UV light source. The UV-light is directed through the transparent electrodes, substrate and PVA, penetrating and curing the adhesive in the center of the sandwich. Exposing the adhesive with the aligned conductive particles to the UV light cures the adhesive and increases the viscosity of the matrix, thereby, inhibiting the particle movement. The matrix (adhesive) with the aligned and connected particle chains was UV cured using a Dymax BlueWave200 spot light system.

The film was separated by first manually separating the electrodes from the PET, and then peeling the PET from the PVA and aligned particle-rich adhesive structure. Thereby, providing a three layer structure comprising of a PVA layer, an adhesive layer with a continuous, connected network of nickel graphite particles aligned parallel to the layer normal, and a PVA layer on the opposite side of the first PVA layer.

Thereafter, the PVA coating was rinsed with water to expose the network nodes at the interfacial surfaces on both sides of the adhesive layer. Once the PVA was completely removed, the film was air dried in ambient conditions for 15 minutes.

After washing and drying as described above, the conductive nature of the adhesive layer was confirmed by sandwiching the layer between two pieces of copper, each with a surface area of approximately 1 square centimetre, and measuring the resistance between the copper pieces with a multimeter. The measured resistance was on the order of 10 Ohm.

The invention claimed is:

1. A method for arranging particles at an interface between a water soluble or non-water soluble matrix comprising particles and a matrix comprising a viscous material and particles, said method comprising the steps of:
   contacting the water soluble or non-water soluble matrix comprising particles and/or the matrix comprising a viscous material and particles with a support comprising at least one side, said at least one side of the support facing the water soluble or non-water soluble matrix comprising particles and/or the matrix comprising a viscous material and particles,
   placing the water soluble or non-water soluble matrix comprising particles in contact with the matrix comprising a viscous material and particles, thereby providing a structure comprising at least one interface between said water soluble or non-water soluble matrix comprising particles and said matrix comprising a viscous material and particles,
   subjecting the particles in said structure to an electric field thereby forming the particles into at least one pathway of particles in the water soluble or non-water soluble matrix comprising particles and in the matrix comprising a viscous material and particles,
   fixating the viscous material so as to fixate the at least one pathway of particles, and
   removing the water soluble or non-water soluble matrix comprising particles by dissolution, thereby exposing a termination of the at least one pathway of particles at the at least one interface,
   wherein the electric field has an electric field strength ranging from 5 to 100 kV/cm.

2. A method according to claim 1, wherein the water soluble or non-water soluble matrix comprises or consists of particles and a water soluble material.

3. A method according to claim 1, wherein said at least one pathway of particles forms part of a network of particles.

4. A method according to claim 1, further comprising the step of:
   subjecting the at least one side of the support to a surface modification technique selected from corona, plasma, or flame treatment.

5. A method according to claim 1, further comprising the step of:
   removing the support from the water soluble or non-water soluble matrix comprising particles and/or the matrix comprising a viscous material and particles.

6. A method according to claim 1, wherein the water soluble or non-water soluble matrix comprising particles is the water soluble matrix comprising particles, and wherein the water soluble matrix comprising particles is removed by rinsing with water or an aqueous solution.

7. A method according to claim 1, wherein the water soluble or non-water soluble matrix comprising particles is the non-water soluble matrix comprising particles, and wherein the non-water soluble matrix comprising particles is removed by rinsing with acids, bases, or organic solvents.

8. A method according to claim 1, wherein the water soluble or non-water soluble matrix comprising particles is the water soluble matrix comprising particles, and wherein the water soluble matrix comprises or consists of particles and one or more water soluble polymers selected from the group consisting of polyvinyl alcohol, cellulose ethers, polyethylene oxide, starch, polyvinylpyrrolidone, polyacrylamide, polyvinyl methylether-maleic anhydride, polymaleic anhydride, styrene maleic anhydride, hydroxyethyl cellulose, methylcellulose, polyethylene glycols, carboxymethylcellulose, polyacrylicacid salts, alginates, acrylamide copolymers, guar gum, casein, ethylene-maleic anhydride resin, polyethyleneimine, ethyl hydroxyethylcellulose, ethyl methylcellulose, and hydroxyetyl methylcellulose.

9. A method according to claim 1, wherein the viscous material of the matrix comprising a viscous material and particles comprises an adhesive and/or an elastomeric material.

10. A method according to claim 1, wherein the particles are conductive particles.

11. A method according to claim 1, wherein the at least one pathway of particles is an electrically conducting pathway of particles.

12. A method according to claim 7, wherein the organic solvent is selected from alcohols, esters, ketones, aldehydes, ethers, and hydrocarbons.

13. A method according to claim 10, wherein the conductive particles are particles of carbon, metal, and/or metal alloys.

* * * * *